United States Patent [19]

Lee et al.

[11] Patent Number: 4,835,116

[45] Date of Patent: May 30, 1989

[54] ANNEALING METHOD FOR III-V DEPOSITION

[75] Inventors: Jhang W. Lee, Mansfield; Richard E. McCullough, Wrentham, both of Mass.

[73] Assignee: Kopin Corporation, Taunton, Mass.

[21] Appl. No.: 120,024

[22] Filed: Nov. 13, 1987

[51] Int. Cl.$^4$ .................... H01L 21/20; H01L 21/324
[52] U.S. Cl. ........................ 437/111; 148/DIG. 25;
148/DIG. 48; 148/DIG. 65; 148/DIG. 94;
148/DIG. 97; 148/DIG. 110; 156/613;
437/126; 437/132; 437/247; 437/936; 437/939;
437/963; 437/973
[58] Field of Search ................ 148/DIG. 3, DIG. 25,
148/DIG. 48, DIG. 56, DIG. 65, DIG. 72,
DIG. 90, DIG. 94, DIG. 97, DIG. 110, DIG.
149, DIG. 169; 156/610–614, 606; 437/81, 82,
104, 107, 126, 132, 247, 936, 939, 943, 946, 963,
967, 973

[56] References Cited

U.S. PATENT DOCUMENTS

| 4,561,916 | 12/1985 | Akiyama et al. | 437/132 |
| 4,632,712 | 12/1986 | Fan et al. | 148/175 |
| 4,699,688 | 10/1987 | Shastry | 156/612 |

OTHER PUBLICATIONS

B. Y. Tsaur et al., *16th IEEE Photovoltaic Spec. Conf. Proc.*, 1143–1148 (1982).
J. W. Lee, *Inst. Phys. Conf. Serv. No. 83: Ch. 3*, 111–116 (1986).
J. W. Lee et al., *Appl. Phys. Lett.*, 50(1):31 (1987).
N. Chang et al., *Appl. Phys. Lettr.*, 49(13):815–817 (1986).
S. S. Lau et al., *Appl. Phys. Lett.*, 34(1):76–78 (1979).
Lee et al., *Mat. Res. Soc. Symp. Proc.*, 91:33 (1987).
Harris et al., *Mat. Res. Soc. Symp. Proc.*, 91:3 (1987).
Nishi et al., "Growth of Single Domain GaAs on 2-inch Si(100) Substrate by Molecular Beam Epitaxy," Jap. J. Appl. Phys. vol. 24, No. 6 Jun. 1985, pp. 1391–1393.
Lee, "MBE Growth of Low Dislocation and High Mobility GaAs on Si," Mat. Res. Soc. Symp., vol. 67, 1986, pp. 29–36.
Lee et al., "Crystal Orientations and Defect Structures of GaAs Layers Grown on Misoriented Si Substrates . . . ", J. Voc. Sci. Tech., B5(3), May/Jun. 1987, pp. 819–821.
Chand et al. "Significant . . . GaAs on/Si(100) by Rapid Thermal Annealing," Appl. Phys. Lett., vol. 49, No. 13, Sep. 29, 1986, pp. 815–817.
Vernon et al., "Heteroepitoxial (Al)GaAs Structures on Ge and Si . . . ", 17th IEEE Photovoltaic Specialists Conf. Kissimmee, Fl., May 1–4, 1984, pp. 434–439.
Hull et al., "Nucleation of GaAs on Si: . . . ", Appl. Phys. Lett., vol. 50, No. 13, Mar. 1987, pp. 851–853.
Sugimura et al., "Heteroepitaxial Growth of GaAs on Sapphire Substrates . . . ", J. Cryst. Growth, vol. 77, (1986), pp. 524–529.
Akiyama et al., "Growth of High Quality GaAs Layers on Si Substrates by MOCUD", J. Crys. Growth, vol. 77, 1986, pp. 490–497.
Lee et al., "Ion Implantation and Annealing Properties of Molecular-Beam Epitaxy Brown GaAson Si," J. Vac. Sci. Tech. B5(3), May 1987, pp. 827–830.
Akiyama et al., "Growth of GaAs on Si by MOCUD," J. Crys. Growth, vol. 68, (1984), pp. 21–26.
Duncan et al., "Photoluminascence . . . of Heteroepitaxial Gallium Ansenide on Silicon," J. Appl. Phys., vol. 59, No. 6, Mar. 15, 1986, pp. 2161–2164.

*Primary Examiner*—Brian E. Hearn
*Assistant Examiner*—William Bunch
*Attorney, Agent, or Firm*—Hamilton, Brook, Smith & Reynolds

[57] ABSTRACT

A method for producing wafers having deposited layers of III-V materials on Si or Ge/Si substrates is disclosed. The method involves the use of multiple in situ and ex situ annealing steps and the formation of a thermal strain layer to produce wafers having a decreased incidence of defects and a balanced thermal strain. The wafers produced thereby are also disclosed.

28 Claims, No Drawings

ANNEALING METHOD FOR III-V DEPOSITION

DESCRIPTION

BACKGROUND OF THE INVENTION

The growth of III-V on Si has been recognized as a highly desirable technology goal for a number of years. The earliest work focused on GaAs solar cells because they were very large area devices where the substrate cost, maximum substrate size, ruggedness and weight (for space applications) were major obstacles for conventional GaAs homoepitaxial approaches. Si substrates provided an attractive solution to all of the above problems. In addition, the alloy composition of AlGaAs can be adjusted to provide an optimum bandgap and absorption match to Si for high efficiency multiple bandgap solar cells. Early efforts attempted the growth of GaAs directly on both single and polycrystal Si, but with very little success. This was not a surprising result because of the expected heteroepitaxial problems created by a 4% lattice mismatch, large thermal expansion mismatch and polar/non-polar interface with antiphase disorder, cross doping and phase segregation. These initial efforts then evolved into a variety of approaches utilizing refractory metals, Ge or Si-Ge graded layers with subsequent growth of GaAs. These structures still faced the polar/non-polar interface problems. While reasonably efficient GaAs on Ge single crystal cells were realized, the results with various interfacial layers on Si were not too encouraging.

About 1981, the potential advantages of large-size wafers, optical interconnects, optoelectronic integrated circuits (OEIC) and monolithic integration of ultra-high speed GaAs with high density Si VLSI pushed a re-examination of the earlier difficulties of direct GaAs/Si heteroepitaxy. There were three key results which have greatly changed the outcome from the prior failures. First was the ability to achieve a clean (relatively O and C free) Si surface. Second was the separation of the nucleation and growth phases in the two-step growth process. Third was the role of tilting the substrate off the direct [100]orientation to form an array of even atomic layer steps in the Si surface to eliminate formation of anti-phase domains. The results of these breakthroughs have made GaAs and other III-V materials on Si increasingly promising from the device and IC perspective.

Recently, nearly all types of GaAs and hetero junction devices have been demonstrated in GaAs/Si. For some applications, the device performance is comparable to conventional GaAs approaches, while for others, especially for optical devices, it is still inferior.

Despite the current progress in producing devices having III-V on Si, a need still exists for such devices having fewer defects and a reduction of the strain caused by the difference of the coefficients of thermal expansion between III-V materials such as GaAs and substrate materials such as Si.

SUMMARY OF THE INVENTION

The method pertains to production of wafers having layers of III-V materials on Si, Ge/Si, or other single crystal substrates. The method further pertains to a process for making wafers having layers of III-V material in which in-situ and ex-situ annealing and a thermal strain layer are used to produce a wafer having a lower incidence of defects and a balance of thermal strains.

In the broadest sense, the invention involves providing a substrate upon which III-V materials are to be deposited and forming a III-V nucleation layer upon the substrate using organometallic chemical vapor deposition. A first III-V buffer layer is deposited upon the nucleation layer. This first buffer layer may contain a dopant material. Following its deposition, the first buffer layer is annealed in-situ or removed from the deposition growth chamber for an ex-situ annealing. The substrate is then returned to the growth chamber and a second III-V buffer layer is formed. This second III-V buffer layer acts to provide a surface to facilitate crystal formation during a subsequent annealing step. A thermal strain layer is formed next by depositing a III-V material upon the second buffer while rapidly cycling the temperature. A III-V buffer layer and a III-V device layer are then deposited upon the thermal strain layer and a final annealing is carried out.

The resulting wafer exhibits a low incidence of defects and a counterbalanced strain. This allows production of devices and end products of a higher quality than previously available.

DETAILED DESCRIPTION OF THE INVENTION

When deposited on Si, Ge/Si or other single crystal substrates, films of III-V materials tend to contain large numbers of defects and high stresses. As used herein the term III-V refers to compound semiconductor crystals containing elements from group IIIA and group VA of the periodic table. More specifically, the term III-V material as used herein refers to compounds which are combinations of the group, of Ga, In and Al, and the group of As, P, and Sb. Representative materials include GaAs, InP, and InSb.

The defects and stresses associated with the deposition of III-V materials on substrates of Si or Ge/Si result in part from the mismatch of thermal expansion coefficients between the two layers. These problems tend to increase greatly when using organometallic chemical vapor deposition (OMCVD) on wafers in excess of three inches in diameter. Defects also occur due to lattice mismatches between the substrate and deposited III-V crystals.

The defects can be minimized and the stresses balanced by using various annealing methods. Furthermore, defects near the III-V/substrate interface region can be further decreased by doping or diffusing certain impurities into the III-V layer prior to annealing. Also, by incorporating steps both in-situ and ex-situ the growth chamber, improvements in the final layered substrate are observed.

It is necessary to start with a substrate of Si or Ge/Si that has been thoroughly cleaned. The substrate is next placed in the growth chamber of an apparatus suitable for OMCVD. Further in-situ heat treatment under an arsine ($AsH_3$) or phosphine ($PH_3$), flow to remove residual impurities is required. At this point, the substrate is lowered to a temperature of between about 300° and 400° C. under a pressure between about 20 and 760 Torr. Once the desired level of heating is achieved, the growth chamber is flowed by an atmosphere which is a mixture of a gas containing group III elements (Ga, Al and In preferred), and a gas containing group V elements (As and P preferred). In one particular embodiment of the invention the gasses are trimethyl gallium (TMG) and arsine ($AsH_3$)

These conditions are maintained until a nucleation layer of between about 10 and 20 nm has been deposited on the substrate surface. The nucleation layer serves as an "anchor" between the substrate and the material which forms the buffer layers of the device.

The buffer layers lie between the substrate and the layer which forms the ultimate device and serves to thin out the incidence of defects. The sections of buffer which lie closer to the substrate tend to have a greater incidence of defects than the buffer sections which are more distant from the substrate. Thus the buffers serve to allow the material of the ultimate device to be isolated from high defect sections of the layered substrate.

The first buffer layer is grown under an atmosphere as described in the nucleation layer growth step. The temperature is raised to between about 600° and 700° C. and maintained until between about 50 and 200 nm of material have been deposited. Alternatively, this buffer can be grown in the presence of dopants such as Zn, Si or S to reduce the incidence of defects by a subsequent annealing. When a dopant is used, it may be possible to use a thinner buffer. Thus, for doped buffers, the deposition temperature is still between about 600° and 700° C., but growth may be ended as early as 20 nm have been deposited. However, a doped buffer of 200 nm is still acceptable.

Once deposited, a first annealing of the buffer is performed in-situ. In this step, the growth chamber temperature is raised to between about 800° and 850° C. for undoped buffers and to between about 750° and 850° C. for doped buffers. In either case, the annealing temperature is maintained for between about 5 and 10 minutes. The in-situ annealing step can be replaced by an ex-situ annealing step. In this case, the substrate is removed from the OMCVD growth chamber and placed in an external furnace or rapid thermal process system. The annealing takes place at between about 750° and 950° C. and lasts for a time between about 5 seconds and 15 minutes. Following completion of this ex-situ annealing step, the substrate is returned to the OMCVD growth chamber.

Once placed back within the growth chamber, the substrate is heated to between 600° and 700° C. and once again exposed to the atmosphere containing the group III and group V elements. These conditions are maintained until about 500 to 1500 nm of new material has been deposited upon the buffer layer.

At this point, a thermal strain layer is produced. The thermal strain layer is another buffer formed by growing the III-V material layer while cycling the process temperature up and down. The fine layers deposited at different temperatures tend to have a high degree of thermally induced strain and serve to counterbalance stresses and strain produced by the difference in thermal expansion coefficients between the substrate and the nucleation layer. Thus, the thermal strain layer lowers the incidence of wafer warping and thermally induced defects in the structure.

As used in this invention, the thermal strain layer is produced by cycling the deposition temperature between about 300° and 750° C. The rate of cycling should be such that each complete cycle results in the deposition of between about 5 and 50 nm of III-V material. The thermal strain layer requires at least one full cycle, but no more than five are necessary to be effective. The position of this thermal strain layer is determined by the device layer structure, but it is within a 500–1500 nm range of the III-V/Si interface.

The III-V material from which the ultimate device will be produced is deposited upon the thermal strain layer. In certain cases, a III-V buffer layer may be deposited before the device layer growth. The composition of this device layer is dependent upon the device being made. Typical layers will be GaAs, InGaAs and AlGaAs. The exact processing conditions will vary with the specific material, however, generally the deposition will be performed at between about 600° and 700° C. Once this layer is of the desired thickness, a final annealing step is often beneficial. While this step again depends upon the material deposited, typical final annealing steps use a temperature of between about 750° and 950° C. for between about 5 seconds and 15 minutes. This final annealing step may be performed either in situ or ex situ.

The wafer produced by the above process comprises a substrate, a nucleation layer, a first buffer layer, a second buffer layer, a thermal strain layer and a device layer.

The III-V/Si and III-V/(Ge/si) wafers produced by this method exhibit a decreased incidence of defects and lower degree of warping due to thermal strain imbalance. This leads to higher quality devices and end products produced using these wafers.

We claim:

1. A method for providing an article having III-V material layers which comprises:
   a. providing a substrate upon which III-V material layers are to be deposited;
   b. forming a III-V nucleation layer upon the substrate via organometallic chemical vapor deposition in a growth chamber;
   c. forming a first III-V film upon the nucleation layer in the growth chamber;
   d. annealing the first III-V film;
   e. forming a second III-V film upon the first III-V film;
   f. continuing the deposition of the second III-V film while simultaneously, repeatedly cycling the temperature between about 300° and 750° C.; and
   g. forming a third III-V film upon the second III-V film to form a layered substrate.

2. A method as in claim 1 wherein the substrate is selected from the group consisting of Si, Ge/Si or other single crystal substrates.

3. A method as in claim 1 wherein the III-V nucleation layer comprises a combination of a material selected from the group consisting of Ga, In and Al and a material selected from the group consisting of As, Sb and P.

4. A method as in claim 3 wherein the III-V nucleation layer comprises a material selected from the group consisting of GaAs, AlGaAs, InGaAs, InP, InGaAsP and InSb.

5. A method as in claim 1 wherein the first III-V film comprises a combination of a material selected from the group consisting of Ga, In and Al and a material selected from the group consisting of As, Sb and P.

6. A method as in claim 5 wherein the first III-V film comprises a material selected from the group consisting of GaAs and InP.

7. A method as in claim 1 wherein the second III-V film comprises a combination of a material selected from the group consisting of Ga, In and Al and a material selected from the group consisting of As and P.

8. A method as in claim 7 wherein the III-V film comprises a material selected from the group consisting of GaAs and InP.

9. A method as in claim 1 wherein the third III-V film comprises a combination of a material selected from the group consisting of Ga, In and Al and a material selected from the group consisting of As, Sb and P.

10. A method as in claim 9 wherein the third III-V film comprises a material selected from the group consisting of GaAs and InP.

11. A method as in claim 1 wherein the III-V nucleation layer is formed to a thickness of between about 10 and about 20 nm.

12. A method as in claim 1 wherin the III-V nucleation layer is formed at a temperature of between about 300° and about 450° C.

13. A method as in claim 1 wherein the first III-V layer is formed to a thickness of between about 50 and about 200 nm.

14. A method of claim 1 wherein the first III-V layer is formed at a temperature of between about 600° and about 700° C.

15. A method as in claim 1 wherein the first III-V layer contains a dopant.

16. A method as in claim 15 wherein the dopant is selected from the group consisting of Zn, S and Si.

17. A method as in claim 15 wherein the first III-V layer is formed to a thickness of between about 20 and 200 nm.

18. A method as in claim 15 wherein the first III-V layer is formed at a temperature of between about 600° and about 700° C.

19. A method as in claim 1 wherein the first III-V layer is annealed in-situ at a temperature of between about 800° and about 850° C. for between about 5 and about 10 minutes.

20. A method as in claim 15 wherein the first III-V layer is annealed in-situ at a temperature of between about 750° and about 850° C. for between about 5 and about 10 minutes.

21. A method as in claim 1 wherein the first III-V layer is annealed ex-situ at a temperature of between about 750° and about 950° C. for between about 5 seconds and about 15 minutes.

22. A method as in claim 1 wherein the second III-V layer is formed to a thickness of between about 500 and about 1500 nm.

23. A method as in claim 1 wherein the second III-V layer is formed at a temperature between about 600° and about 700° C.

24. A method as in claim 1 wherein the temperature cycling during the continued deposition of the second III-V layer is repeated between 1 and 5 times.

25. A method as in claim 24 wherein during each cycle, between about 5 and about 50 nm of III-V material is deposited.

26. A method as in claim 1 wherein the third III-V layer is formed at a temperature between about 600° and about 700° C. to a desired thickness.

27. A method as in claim 1 wherein the layered substrate is annealed at a temperature of between about 750° and about 950° C. for between about 5 seconds and about 15 minutes.

28. A method as in claim 1 wherein the forming of a second III-V film occurs concurrently with the annealing of the first III-V film.

* * * * *